Figure 1:
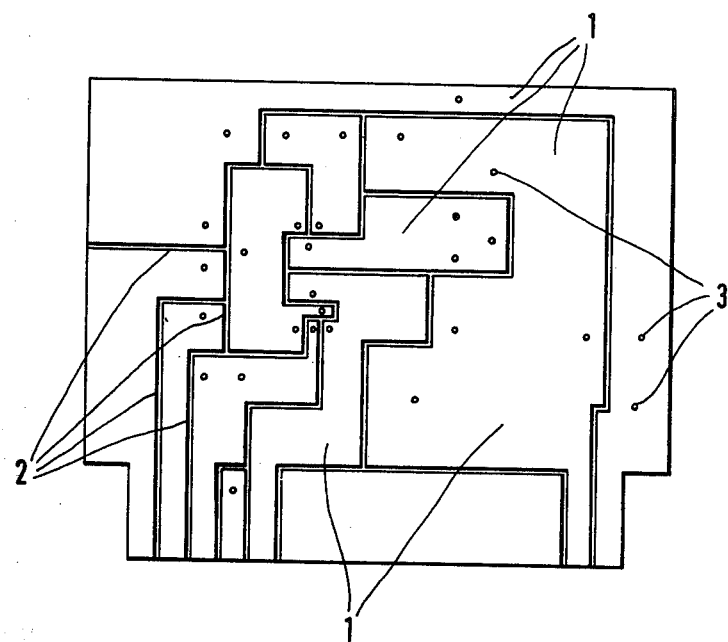

United States Patent [19]

Seebach

[11] 4,138,924
[45] Feb. 13, 1979

[54] METHOD FOR THE PRODUCTION OF CONDUCTOR PLATES

[76] Inventor: Jürgen Seebach, Beekestr. 105, 3000 Hannover, Fed. Rep. of Germany

[21] Appl. No.: 672,080

[22] Filed: Mar. 30, 1976

[30] Foreign Application Priority Data

Jul. 12, 1975 [DE] Fed. Rep. of Germany ....... 2531196

[51] Int. Cl.² ............................................. B23C 1/16
[52] U.S. Cl. ................................. 90/13.2; 90/11 C; 29/625
[58] Field of Search ............. 29/624, 625; 144/144 R; 90/62 A, 13.2, 13.1, 11 C

[56] References Cited

U.S. PATENT DOCUMENTS

| 3,516,327 | 6/1970 | Wilson | 90/11 E |
| 3,555,964 | 1/1971 | Fleming | 90/11 E X |
| 3,777,616 | 12/1973 | Mueller | 90/13.2 |

FOREIGN PATENT DOCUMENTS 800064  8/1958  United Kingdom ...................... 29/625

OTHER PUBLICATIONS

W. R. Jernigan, et al., Insulation/Circuits of Oct. 1970, pp. 21–23.

Primary Examiner—Gil Weidenfeld
Attorney, Agent, or Firm—Warren, Chickering & Grunewald

[57] ABSTRACT

A method for making electrical circuits on a non-conductive plate is disclosed. The invention provides for duplication of a circuit pattern on an insulating plate having a continuous deposit of electrically conductive material thereon by a mechanical linkage between a milling device, which removes the conductive deposit, and a scanning device, which is moved in accordance with a master pattern. In preferred embodiment the movement of both devices is confined to one of two or sometimes three co-ordinates for a particular portion of the pattern. The method is swift and efficient, and the invention is equally applicable to small or large-scale manufacture, although it is of especial value where small numbers of circuit boards are to be produced.

1 Claim, 5 Drawing Figures

METHOD FOR THE PRODUCTION OF CONDUCTOR PLATES

BACKGROUND TO THE INVENTION

Conductor plates or electrical circuit boards wherein the starting material consists of plates of insulating material with a continuous layer of copper deposit on one or both sides, and wherein the desired layout or pattern of the conducting paths and connection areas is then produced by removing the copper layer at specific regions, are generally known as "printed circuits." In the classic method of manufacturing printed circuits the planned conductor layout or pattern of the desired electrical circuit arrangement is applied to the continuous copper layer. The copper areas which are not covered by the conductor layout are removed by suitable etching methods and thus give the desired electrical separation of the individual conductor paths and connection areas. The copper portions which adhere to the insulating plate and which represent the conductor paths remain, and together these paths reproduce the desired pattern of conductors in every detail. This method is very well suited to mass production but it is too expensive for small quantities and laboratory samples, which are often required in the electronics industry. In such prior art methods, it is necessary to go through the following method steps:
  1. Planning the conductor layout as a drawing
  2. Transferring the drawing on to photographic film by means of a camera
  3. Producing a printing master
  4. Printing on the copper-coated plastic material plate
  5. Etching the copper layer
  6. Cleaning and drying
  7. Drilling the holes.

There have been many attempts to produce such circuits by mechanical methods, which would avoid such chemical processes. For example, German Offenlegungsschrift No. 2,000,571, and Swiss Patent Specification No. 399,559 propose the replacement of the etching method by means of an engraving machine or by spark erosion (German Pat. No. 1,155,497).

In these methods the master is optically scanned line by line, and from the optical information electrical signals are derived, which are determined by the light and dark regions of the pattern which appear in each line. The tool is moved to and fro over the conductor plate in accordance with these signals, so that line for line the copper layer is interrupted at the necessary portions in each case.

Although these methods are in some ways simpler than the etching process, the equipment is relatively expensive and the process is slower than is desirable. For example, an exact drawing must be produced for the pattern, in which it is necessary to provide complicated lines and areas with uniform blackening. An electronic circuit arrangement is required for converting the optical image of the master into the control movements for the tool. A further disadvantage is that irrespective of whether the master has an extensive and complicated conductor layout or a master containing only a few conductors, it is always necessary to go through the entire pattern, so that the time required for the process remains large, even for a simple pattern. Additionally, the working speed is limited because of the mass of the tool unit which has to be moved in and out. Furthermore, these methods do not make it possible to produce sharp outlines at the interruptions in the copper plate which extend obliquely relatively to the line direction, since these interruptions comprise at their edges steps depending on the fineness of the pattern.

SUMMARY OF THE INVENTION

The invention relates to a method for the production of electrical circuit boards using plates made of electrically insulating material having on one or both sides a continuous deposit of electrically conductive material. The interruptions required for forming the circuit are produced in the deposit by a material-removing tool.

According to the method of the invention, a master pattern is scanned along lines thereof defining the portions of the deposit which are to be removed, and the conductive deposit on the insulated plate is milled away in accordance with these lines. The pattern of deposit left on the plate after milling is the electrical circuit corresponding to the pattern. A rotating milling cutter is normally used, and the milling is preferably performed so as to cut lines of constant width in the deposit.

In preferred embodiment the lines milled in the deposit are each straight or linear and in one of two perpendicular directions, although a third co-ordinate inclined at 45° may also be useful.

A conductor plate or circuit board produced in accordance with the preferred method of the invention has a completely different appearance from the usual printed circuits board, since the interruptions of the copper deposit only consist of straight lines which are substantially at right angles to one another or inclined at an angle of 45° thereto. The copying apparatus and also the production of the master are substantially simplified as a result, since the master also need only contains straight lines, so that a simple sketch is sufficient for the master pattern. The transfer from the sketch to the conductor plate can be carried out with the use of a simple mechanical apparatus, manually or, if appropriate, in a fully automatic manner. Since the milling cutter has to be adjusted vertically only at the beginning and at the end of a line in each case, the same difficulty relating to the masses which have to be moved does not exist in the present invention as does exist in known prior pattern scanning methods. If the conductor plate comprises only a very simple circuit diagram, the corresponding work involved is also very slight, since only the division lines actually necessary have to be produced in the conductor plate.

An important alternative feature of the method of the invention, however, is that after the lines have been milled-in the vertical travel of the milling tool may be increased to drill into the conductor paths and the connection areas, through holes for receiving the connection wires of the circuit elements. This means a very considerable time-saving simplification since it is no longer necessary to re-fix the conductor plate in another drilling apparatus, and the holes can be produced in an easy way in accordance with the master.

To control the copying or following of the pattern a simple light source is sufficient. Projecting a spot of light on to the master, the light source is guided along the lines of the master, and then the milling cutter carries out a similar working movement automatically.

Apparatus for carrying out the method of the invention comprises a work table, means for securing the master pattern or sketch as well as the circuit board or plate thereto, and a framework mounted on the work table and carrying scanning means and milling means spaced from each other. The scanning means and milling means are operatively linked for synchronous movement over the master pattern and the circuit board or plate, respectively, in two degrees of freedom parallel to the work table.

The framework carrying the scanning means and the milling means is normally a slide rail construction and in the preferred embodiment comprises a first pair of parallel slide rails fixedly secured to the work table, an intermediate plate slidably mounted on said first pair of slide rails for movement therealong, and a second pair of parallel slide rails slidably mounted on the intermediate plate. The scanning means and the milling means being carried by said second pair of slide rails. In use, the scanning means are mounted at one end of the second pair of rails and the milling means at the other, the first pair of rails extending between the master pattern and plate.

The movement of the scanning means and milling means may be confined to a direction parallel to one pair of rails by locking or arresting the intermediate plate with respect to the other pair. This can be useful in copying straight lines from the master.

Figure 2:
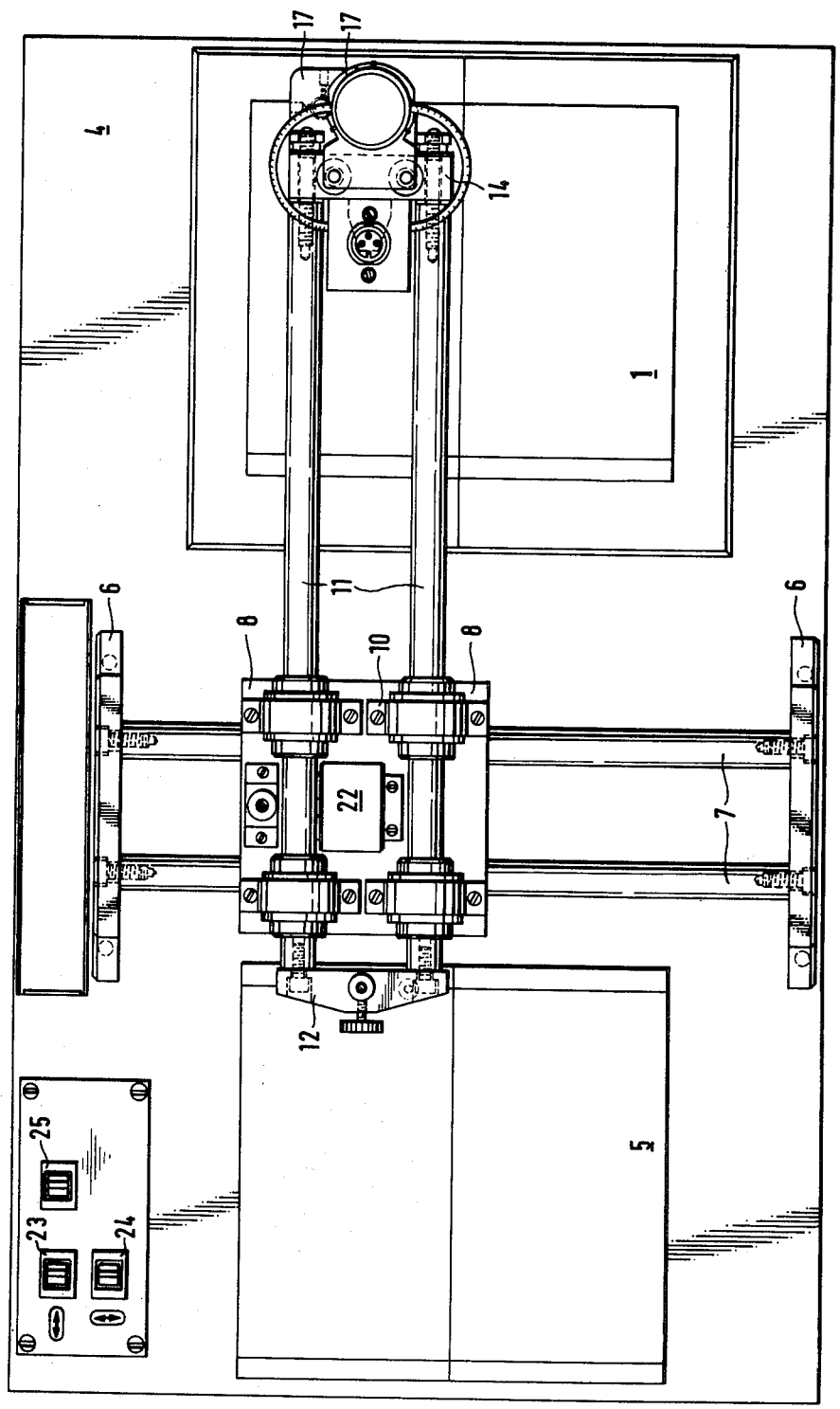
Figure 3:
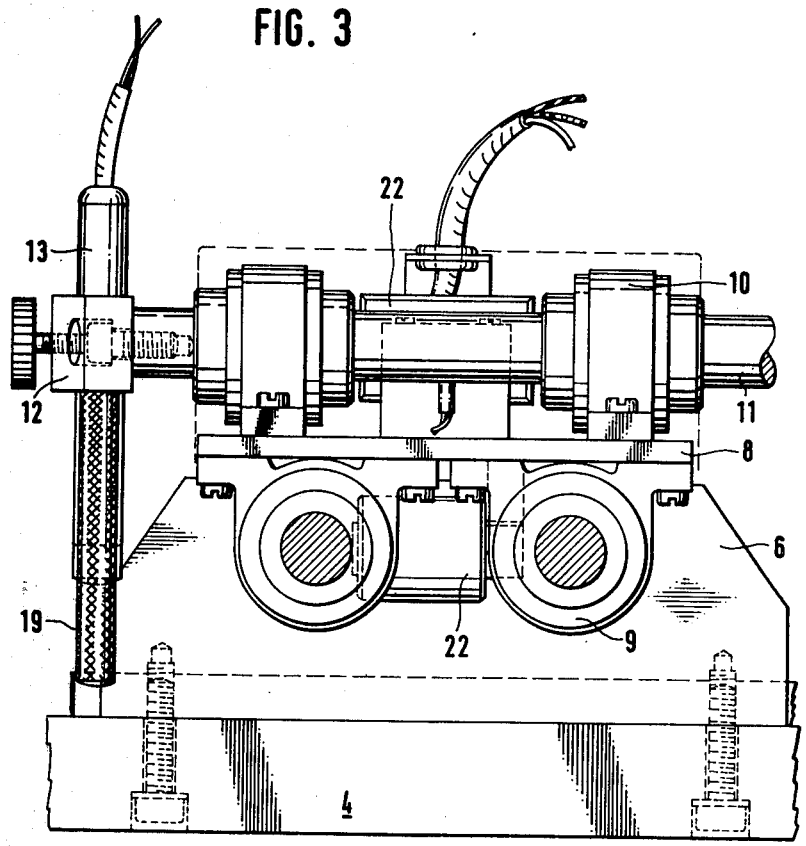
Figure 4:
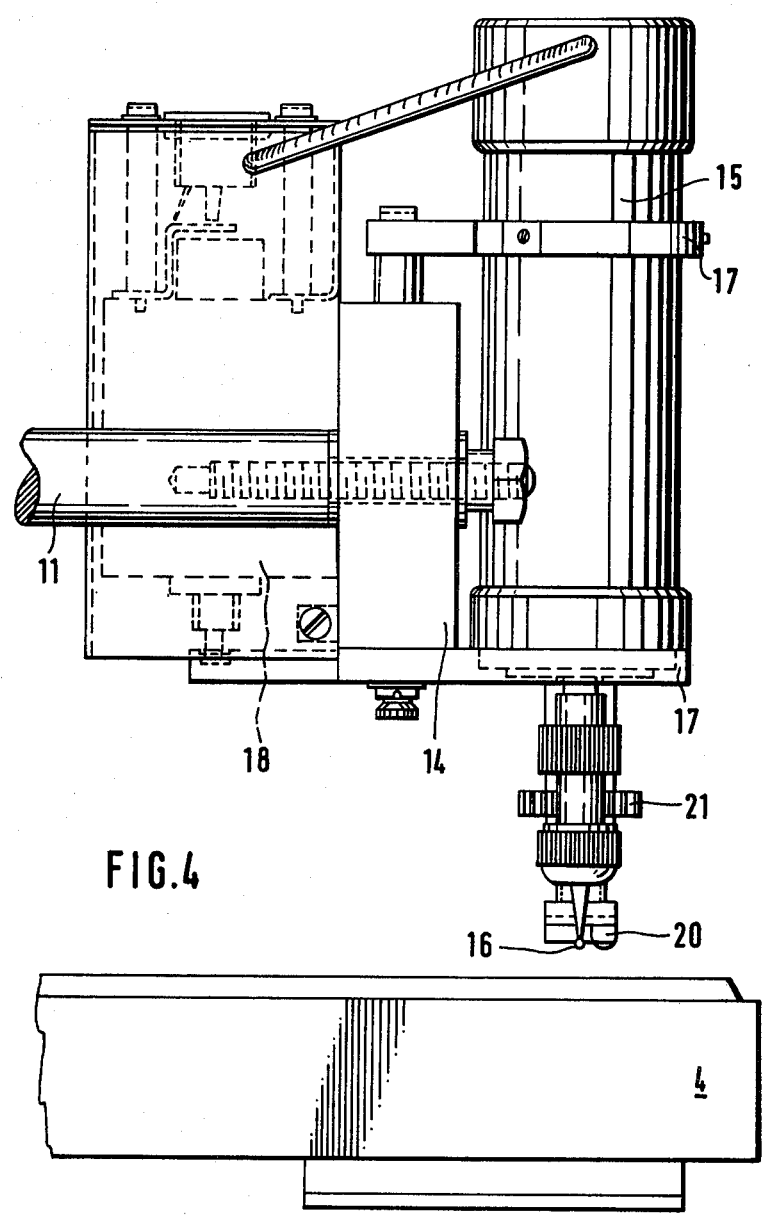
Figure 5:
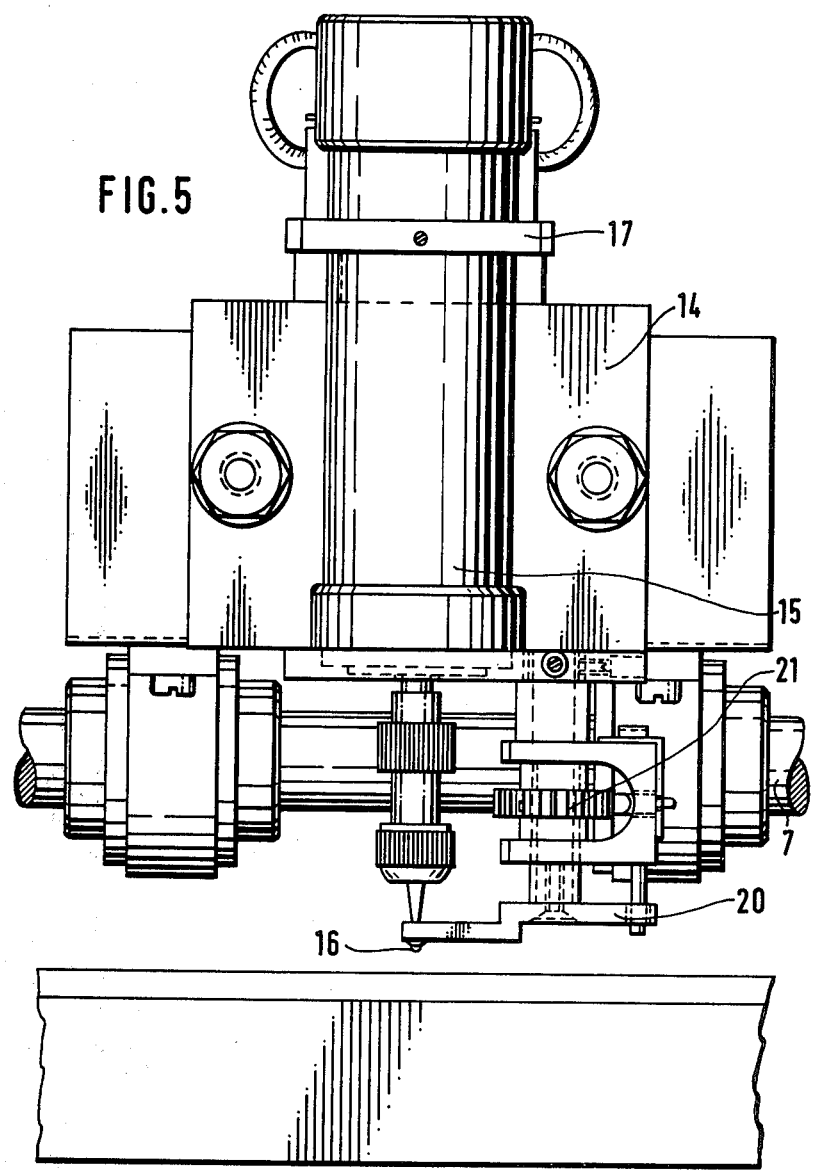

The invention will now be described by way of example and with reference to the accompanying drawings wherein:

FIG. 1 shows a conductor plate or circuit board produced in accordance with the method proposed by the present invention, FIG. 2 shows a plan view of an apparatus for carrying out the method according to the invention, FIG. 3 shows a side view of the intermediate plate mounted on the stationary pair of slide rails, with the optical system for copying, FIG. 4 shows the milling cutter in side view, and FIG. 5 shows the milling cutter in front view.

FIG. 1 shows a conductor plate 1 produced by the method according to the invention, interruptions being milled into the metal coating of the said plate in the form of lines 2 at right angles to one another, and in which holes 3 are provided at the same time for receiving the connection wires of the circuit elements.

The apparatus of the present invention, shown in plan view in FIG. 2, for the production of such conductor plates comprises a work table 4 on which a master pattern or sketch 5 and the conductor plate 1, which is to be treated, can be arranged spaced from one another. Between the zone for the master and the zone for the conductor plate there are secured, parallel to one another on the work table 4 two supports 6 between which a pair of slide rails 7 are arranged parallel to the surface of the work table 4. On this pair of slide rails 7 there is mounted, to be capable of displacement in bearings 9 (FIG. 3) in the direction of the axes of the pair of slide rails 7, an intermediate plate 8; and on the intermediate plate 8 there are arranged bearings 10 in which a pair of slide rails 11 are mounted to be capable of displacement, these slide rails being directed at right angles to the pair of slide rails 7. Secured on one end of the pair of slide rails 11 is a support 12 in which an optical system 13 is arranged with which a spot of light can be projected on to the master 5. Fixed on the other end of the pair of slide rails 11 is a support 14 (FIGS. 4 and 5) on which the motor 15 with the milling tool 16 is mounted by means of holders 17, including a thrust magnet 18 for controlling the vertical movement of the milling tool 16.

By a handle 19 on the support 12 the intermediate plate 8 can be moved to and fro on the one hand on the pair of slide rails 7 and on the other hand the pair of slide rails 11 relatively to the intermediate plate. By this movement the spot of light produced by the optical system can be guided along the lines of the master, and the milling tool will carry out a similar movement. A foot control not shown here is provided for actuating the thrust magnet 18 which moves the motor 15 in its holder 17 perpendicularly onto the conductor plate 1 to such an extent that the milling tool 16 can carry out, in the metal deposit layer on the conductor plate, its material-removing function for producing the linear interruptions or discontinuities. A return spring (also not shown) ensures that when the current supply to the thrust magnet 18 is shut off the motor 15 is made to return into its normal upper position.

By means of a screw 21 the relative position of an abutment 20 in relation to the milling tool 16 can be adjusted so that in this way it is possible to adjust precisely the depth to which the milling tool penetrates into the conductor plate. The abutment coming to rest on the conductor plate ensures that once the cutting depth has been set it is always maintained irrespective of the thickness of the conductor plate which has to be dealt with.

In order to machine the conductor plate, the optical system is moved over the master or sketch in such a manner that the spot of light stands at the commencement point of a drawn division line. Then the milling tool is pressed on to the conductor plate 1 by switching-on the magnet 18 and the copying system is moved by means of the handle 19 by hand in the direction of the division line, and at the end of the line the magnet is switched-off so that the milling tool slides back into the inoperative position over the conductor plate.

In order to ensure that in fact straight lines are milled in the conductor plate in accordance with the straight lines on the master, means are provided for the selective arresting or locking of the intermediate plate 8 on the stationary pair of slide rails 7 and arresting or locking of the second pair of slide rails 11 on the intermediate plate 8.

In the illustrated embodiment the arresting or locking means comprise a solenoid 22 which is mounted on the intermediate plate 8 and whose armature is adapted to be applied by operation of a switch 23 or 24, respectively, selectively on at least one rail of the pair of slide rails 7 or 11. Other arresting or locking systems may also be employed. Simple mechanical systems are quite as effective and a lever linkage selectively urging a brake shoe against one or more rails is contemplated. A switch 25 is used for switching-on the motor 15 for the milling tool.

The abutment 20 is rounded at its lower end so that it can slide without difficulty on the surface of the conductor plate. The height of the abutment in relation to the tip of the milling tool can be adjusted in the direction of the axis of the motor 15 by about 5 mm. By using a fine screwthread this vertical adjustment can be effected to an accuracy of 0.1 mm.

The apparatus according to the present invention makes it possible to draw into the master for producing the conductor paths the holes which are required at the same time, since after the division lines have been milled-in, it is simply necessary to adjust the spot of light to the points in the drawing indicating the holes and operate the thrust magnet, after the abutment 20 has been adjusted to such an extent that the milling tool can pass through the entire thickness of the conductor plate.

The master 5 and the conductor plate 1 are secured on the work table 4 preferably by adhesive tapes. But instead of this technique it is possible, where necessary, to use another fixing means, for example they can be applied by means of strips or blocks consisting of magnetic material, if the work table is made of steel or the like.

The invention makes it possible to produce both individual conductor plates and also large numbers of conductor plates in a very short time without chemical or photographic processes and without corresponding specialists being needed, and there is no need for the special drilling machines required with all the hitherto known methods for producing the holes required for introducing the circuit elements. Therefore an apparatus of this kind is particularly suitable for workshops, scientific institutes and development laboratories, where there is often a need to produce individual items or samples. The invention is also suitable for firms who are equipped for the manufacture of electronic and electrical special appliances and produce only small numbers of items of such appliances.

The invention may also be used for mass production, guiding for example five to ten milling tools synchronously over a corresponding number of conductor plates. If guiding is effected for example by drives using spindles and step-by-step motors, programmed control of the machine is also possible. The input process can be carried out by again using an optical system whose light spot is guided over the master drawing during programming. In such a case, of course, this would not be done by hand control, but for example, by the manual operation of a co-ordinate switch which controls the motors and their direction of rotation. The thrust magnet 18 is operated by means of the foot control and its function is included in the programme. The abutment 21 in this case is so constructed that its adjustment is also possible through the agency of the programming. After the programming is completed the machine can produce conductor plates in any desired numbers by means of the programme stored in it.

I claim:

1. A method of economically producing in small quantities electrical circuit boards each formed from a plate of electrically insulating material having a continuous deposit of electrically conductive material on at least one side thereof, said method including the steps of guiding scanning means over a master pattern having an electrical circuit defined thereon, said guiding step being accomplished by moving said scanning means along lines defining areas of said electrical circuit therebetween, and cutting portions of said electrically conductive material from a side of said plate by milling means operatively linked for synchronous movement with said scanning means to produce areas of conductive material defining said circuit, wherein the improvement in said method is comprised of:

prior to said guiding and cutting steps, locking said scanning means and said milling means for movement confined to a straight line extending in a first of two mutually perpendicular directions, during said guiding step, moving said scanning means over said master pattern along said straight line in said first of said directions proximate areas defining said electrical circuit to cause cutting of said electrically conductive material by said milling means along said straight line in said first of said directions, thereafter locking said scanning and said milling means for movement along a straight line in a remainder of said two mutually perpendicular directions, further guiding said scanning means by moving said scanning means over said master pattern along said straight line in said remainder of said directions proximate areas defining said electrical circuit to cause cutting of said electrically conductive material by said cutting means along said straight line in said remainder of said directions in order to define areas on said plate producing said electrical circuit which areas on said plate closely approximate said areas on said master pattern, and prior to removal of said plate from a position enabling cutting by said milling means, the additional step of cutting completely through said electrically conductive material and said electrically insulating material with said milling means at predetermined locations as indicated on said master pattern to provide openings for connection of external electrical elements to said circuit board.

* * * * *